INTEGRABLE FREQUENCY SELECTIVE NETWORKS FOR TV

Filed July 1, 1968 3 Sheets-Sheet 1

INVENTOR.
KURT HILLMAN
BY Joseph H. Roediger
ATTORNEY.

INVENTOR.
KURT HILLMAN
BY Joseph H. Roediger
ATTORNEY.

Oct. 13, 1970 K. HILLMAN 3,534,277

INTEGRABLE FREQUENCY SELECTIVE NETWORKS FOR TV

Filed July 1, 1968 3 Sheets-Sheet 3

INVENTOR.
KURT HILLMAN
BY Joseph H. Roediger
ATTORNEY.

United States Patent Office 3,534,277

Patented Oct. 13, 1970

3,534,277

INTEGRABLE FREQUENCY SELECTIVE NETWORKS FOR TV

Kurt Hillman, Centerport, N.Y., assignor to General Telephone & Electronics Laboratories Incorporated, a corporation of Delaware Filed July 1, 1968, Ser. No. 741,457
Int. Cl. H03f 1/34
U.S. Cl. 330—21 2 Claims

ABSTRACT OF THE DISCLOSURE

A frequency selective network especially suited for fabrication by integrated circuit techniques is described. The network need contain only transistors and resistors and utilizes positive feedback to obtain frequency selectivity. The positive feedback loop relies on the inherent phase shift and delay of the transistors thereby avoiding the use of RC phase shifting networks. Stabilization of the transistors is obtained by utilizing individual negative feedback loops.

BACKGROUND OF THE INVENTION

This invention relates to frequency selective networks employing positive feedback to obtain frequency selectivity and, more particularly, to a frequency selective network comprised of transistors and resistors which is suitable for fabrication by integrated circuit techniques.

The term integrated circuit refers to a monolithic semiconductor device which is the equivalent of a network containing interconnected active and passive circuit elements. Generally, integrated circuits are either of the digital or the linear type. This invention relates to the linear or analogue type of the integrated circuit. At the present state of the art, linear integrated circuits are limited in the functions in which they can perform due to the fact that no satisfactory way of integrating an inductor is known. As a result, any inductors required by a linear circuit have to be mounted external to the integrated circuit device and connected through suitable contact areas. Since the use of external components reduces the advantages inherent in integrated circuits, the number of inductors and inductor tuned circuits should be kept at a minimum. In addition, capacitors are not preferred components in integrated circuits since they require a considerable area on the integrated circuit chip and thereby reduce the size and number of circuit components which can be contained in a single package.

In practice, the preferred components for integrated circuits are transistors and resistors. This has created problems for the circuit designer who wishes to obtain frequency selectivity in an integrated circuit since conventional frequency selective circuits rely on the use of capacitors and/or inductors as the frequency-dependent elements. In addition to the limitation on the types of components contained in an integrated circuit, the integrated components show a strong dependence upon ambient conditions and manufacturing tolerances. Since circuit response is adversely affected by variations in both the active and the passive component characteristics. the potential for variation in component operating characteristics has further restricted the circuit designer in the provision of frequency selective networks. For example, the use of positive feedback to provide frequency selectivity has not been favored due to the need to operate close to the region of instability.

The present invention utilizes overall positive feedback in a network comprised of transistors and resistors and containing negative feedback loops to stabilize the active elements, i.e. the transistors. While the use of positive feedback to obtain frequency selectivity places the operation of the circuit close to an oscillatory condition, the absence of RC phase shifting networks between active elements in the present circuit enhances the loop gain and the negative feedback available for stabilization. As a result, sufficient amounts of negative feedback are available to compensate for the instability normally encountered by variations in the operating parameters of the components in an integrated circuit. The transistor-resistor networks may be cascaded in a manner similar to that of conventional tuned circuits to obtain an integrated I.F. amplifier for a television receiver.

SUMMARY OF THE INVENTION

The present frequency selective network comprises a plurality of amplifier circuits which are coupled in tandem to form a cascade. Each amplifier circuit includes a transistor as the active semiconductor element. The frequency selectivity of the network is obtained by coupling a positive feedback circuit between the output terminal of the last amplifier circuit in the cascade and the input terminal of the first amplifier circuit. These terminals are referred to herein as the cascade input and output terminals respectively.

Each amplifier circuit in the cascade exhibits a characteristic gain which contributes to the overall forward gain $\mu_0$ of the cascade. The positive feedback loop of the network applies a portion $\beta_0$ of the output signal of the cascade to its input terminal. In the frequency band of interest, the signal being fed back is essentially in phase with the signal applied to the cascade input terminal. The product of the forward gain of the cascade $\mu_0$ and the feedback signal $\beta_0$ is required to be less than 1.0 in order to prevent the positive feedback from producing uncontrollable oscillations. Since the forward gain of the cascade is substantially non-frequency-selective and the feedback circuit supplies a relatively fixed portion $\beta_0$, the magnitude of the loop gain $|\mu_0\beta_0|$ is substantially non-frequency-selective.

The frequency selectivity of the network is provided by utilizing the inherent phase shift and time delay of the active semiconductor elements in the individual amplifier circuits. The cumulative phase shift and time delay of the amplifier circuits in the cascade is utilized so that at the center frequency of the band of interest the phase shift of the signal fed back to the input terminal of the cascade is essentially 360°, i.e. in phase with the input signal to the cascade. As the frequency of the input signal to the cascade varies, the amount of phase shift provided by the individual amplifier circuits changes. This results in a decreased positive feedback signal and a resultant decrease in the output signal of the network. Thus, the phase shift and the resultant frequency selectivity are provided without employing inductors and/or capacitors in the network.

The selectivity or Q of the network is determined by how rapidly the response falls off for signals outside the desired frequency band. Thus, the loop gain $\mu_0\beta_0$ is required to be relatively close to the 1.0 value characteristic of instability and the network operates close to the point of instability. However, negative feedback introduced into the amplifier circuits stabilizes the gain of the corresponding active elements and, in effect, prevents the forward gain from varying significantly with operating conditions. Since the overall phase shift of the network is provided without the use of RC phase shifting circuits, the signal available for the negative feedback is relatively large. This is due to the fact that phase shift circuits and the attenuation typically introduced thereby are not required in the present frequency selective network. In other words, by obtaining the phase shift from the active elements themselves, the losses of the circuits are reduced and the loop gain available for individual negative feedback loops is not substantially degenerated thereby.

The amount of negative feedback for the individual amplifier circuits is enhanced in preferred embodiments by the use of buffer stages, such as emitter followers, which are coupled between adjacent amplifier circuits in the cascade. Also, buffer circuits may be located at the input and output terminals of the cascade. The buffer circuits reduce the loading of the individual amplifier and also establish the D.C. level at each stage. In addition, the number of amplifier circuits in the cascade in preferably an odd number so that the positive feedback loop supplies an in-phase R.F. signal and at the same time provides a negative feedback of the D.C. level appearing at the output of the cascade. This overall negative D.C. feedback imparts increased stability to the network.

Further features and advantages of the invention will become more readily apparent from the following detailed description of a specific embodiment when taken in conjunction with the accompanying drawings.

BRIEF DESCRIPTION OF THE DRAWINGS

FIG. 3 is an electrical schematic diagram of the embodiment of FIG. 1.

DESCRIPTION OF THE PREFERRED EMBODIMENT

Figure 1:
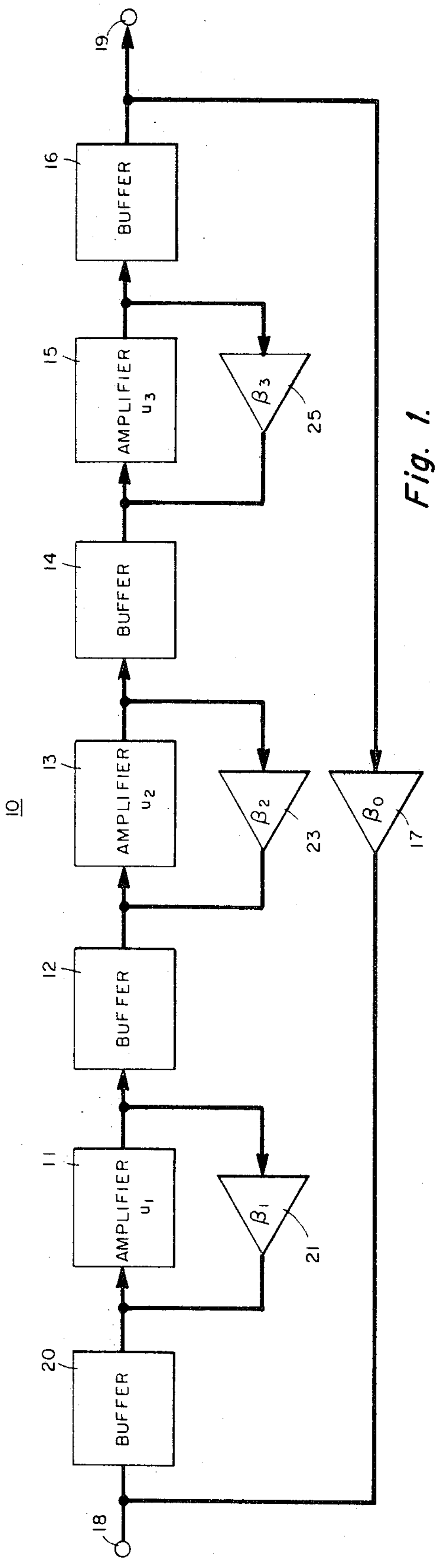
FIG. 1 is a block schematic diagram of one embodiment of the invention.

Referring now to FIG. 1, the frequency selective network 10 is shown containing a plurality of amplifier circuits 11, 13, 15 coupled in tandem to form a cascade between input terminal 18 and output terminal 19. In addition, buffer stages 12, 14 and 16 are coupled at the output of each amplifier stage and provide a high impedance load for the corresponding amplifier circuit and thereby reduce the loading of the active element in the preceding amplifier. Also, a buffer stage 20 is coupled between input terminal 18 and first amplifier 11.

The individual amplifier circuits have characteristic gains $\mu_1$, $\mu_2$, $\mu_3$ and are provided with negative feedback loops 21, 23, 25 which serve to stabilize the operating point of the corresponding amplifier. The negative feedback circuits couple a portion $\beta_1$, $\beta_2$, $\beta_3$ of the output of the corresponding amplifier to its input terminal. The portion fed back is shifted in phase by 180° so that the feedback is negative and decreases the input signal to the amplifier. The overall gain of the cascade is denoted herein as T and is determined primarily by the product of the amplification factors of the individual amplifier circuits. While an individual negative feedback loop is provided for each transistor, the desired stability of the circuit may be obtained by providing negative feedback loops which incorporate more than one amplifier circuit.

Figure 2B:
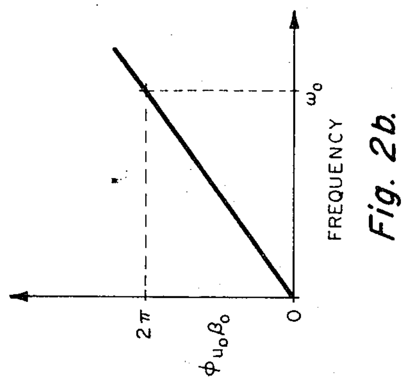
FIGS. 2*a* and 2*b* show the loop gain and phase shift of the embodiment of FIG. 1 as a function of frequency.
Figure 2A:
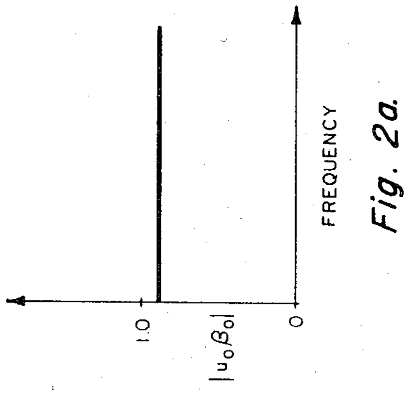
Figure 1:
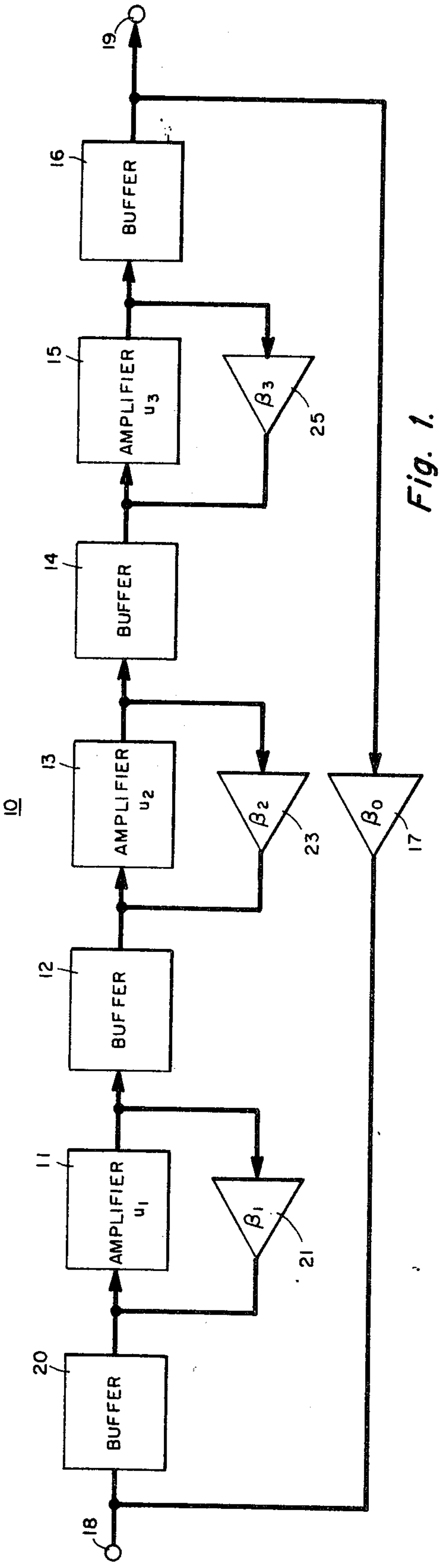
Figure 2B:
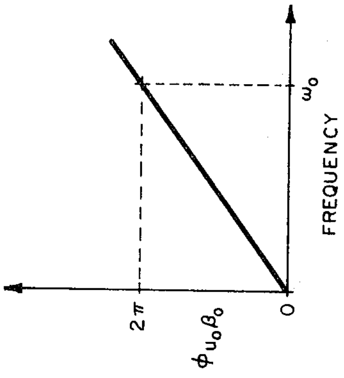
Figure 2A:
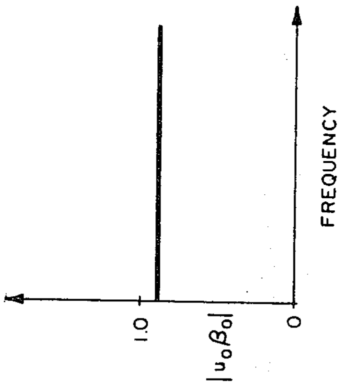

The cascade is provided with an overall or major feedback loop 17 which transmits a portion $\beta_0$ of the output signal of the cascade to the input terminal thereof. In an analysis of an idealized network, the cascade can be assumed to exhibit a non-frequency-selective forward gain $\mu_0$ while in the feedback path there exists non-frequency-selective transmission $\beta_0$. Thus, the magnitude of the loop gain characteristic, $|\mu_0\beta_0|$ as shown in FIG. 2*a*, has a flat amplitude characteristic. In practice, the gain of transistors normally falls off with increasing frequency. The loop gain characteristic $\mu_0\beta_0$ exhibits a linear phase $\phi_{\mu\beta}$ as shown in FIG. 2*b*. The phase slope increases with increasing frequency and provides a 360° phase shift with respect to the signal at terminal 18 at the center frequency $\omega_0$.

The overall amplification factor of the network T is determined by the relationship $$T = \frac{\mu_0}{(1-\mu_0\beta_0)}$$

At the frequency $\omega_0$, the phase of $\mu_0\beta_0$ reaches $2\pi$ radians or 360° and the denominator of the above expression reaches a minimum value, corresponding to a peaking in the response of the loop. Since the denominator of the overall amplification factor T approaches zero as the loop gain characteristic $\mu_0\beta_0$ approaches 1, the product $\mu_0\beta_0$ is required to be less than 1.0 in order to prevent the circuit from becoming unstable and oscillatory. The magnitude of the loop gain characteristic determines the sensitivity and response of the frequency-selective network. This result is due to the fact that a variation in the frequency of the input signal appearing at terminal 18 changes the phase $\phi$ of $\mu_0\beta_0$. This causes the denominator of the amplification factor T to increase and, thereby results in the network response falling off.

The frequency response or selectivity Q of the network is found to be determined by the following expression $$Q \cong \frac{\pi/2}{(1-\mu_0\beta_0)}$$

for operation wherein the loop gain $\mu_0\beta_0$ approaches one. Consequently, a network having a Q of 10 is found to require an approximate loop gain of 0.85. It shall be noted that this amount of loop gain places the circuit close to instability due to the fact that an increase in the gain of the amplifier circuits which results in a loop gain of $15/85 \times 100$ or approximaely 18% creates instability. However, the use of negative feedback loops with the amplifier circuits improves the stability of the individual amplifiers and the network. For example, 20 db of negative feedback due to feedback loops 21, 23 and 25 reduces the variation in loop gain due to the above unstabilized variation in amplifier gain characteristic to 1.8% without substantially altering the performance of the network. In this embodiment, a 50% increase in the individual gains $\mu_1$, $\mu_2$, $\mu_3$ results in an increase in $\mu_0\beta_0$ of 0.85 to 0.9 and thereby increases Q to 15. Consequently, the network is relatively insensitive to variations in the component operating characteristics.

Since the individual negative feedback loops are utilized to stabilize the network, the delay or phase shift of the R.F. signal applied to input terminal 18 must be provided without significantly degrading the individual amplifier loop gains available for the negative feedback. This result is obtained in the network 10 by utilizing the time delay and phase shift of the active semiconductor elements, i.e. transistors, rather than employing conventional phase shifting circuits. By utilizing the inherent phase shift and delay of the transistors, the required phase shift is provided and the circuit losses are reduced. In addition, the network utilizes a number of amplifier circuits which in combination with the phase shift of the feedback loop 17 provide a cumulative 360° phase shift between the R.F. signal at terminal 18 and the signal fed back to the input of amplifier circuit 11.

The number of amplifier circuits employed in a particular embodiment depends on two factors, one, the amount of phase shift provided by the individual stages utilized in the cascade and, two, any phase shift introduced by the overall feedback loop. Presently available transistors can provide a phase shift of essentially 60° at frequencies of approximately 40 mHz. Thus, three amplifier circuits connected in tandem can be utilized in the network to provide a 180° phase shift of the R.F. signals. In addition, the odd number of amplifier circuits provides a 180° phase shift of both the R.F. and D.C. signals, exclusive of the R.F. phase shift of the active elements. This type of network is preferred since overall stabilization is enhanced by D.C. negative feedback. Also, each amplifier circuit is stabilized by negative R.F. and D.C. feedback and is therefore relatively insensitive to temperature changes and variation in supply voltage. It shall be noted that amplifier 11 in FIG. 3 contains a variable resistor 32 in its collector circuit. While not required for normal operation, this resistor permits the Q of the network to be adjusted since it controls in part the gain of amplifier 11.

The embodiment of FIG. 1 is shown in detail in FIG. 3. The buffer stages 20, 12 and 14 are individual emitter follower circuits and due to their characteristically high input impedance minimize the loading of amplifier circuits 11 and 13. Buffer stage 16 includes three emitter follower circuits connected in tandem between the output of amplifier 15 and output terminal 19 to minimize the loading of transistor 56 of amplifier 15 and to permit the overall feedback loop 17 to be isolated from output terminal 19 by transistor 59. The particular number or type of circuits utilized in the buffer stage 16 may be varied for different applications.

The amplifier circuits 11, 13 and 15 contain transistors 52, 54 and 56, respectively, as the active elements. In addition, a negative feedback loop is provided for each amplifier by the incorporation of an emitter resistor therein. In the embodiment shown, the phase shift provided by each transistor in an amplifier circuit is approximately 60° at 40 mHz. so that amplifier circuits 11, 13 and 15 provide a cumulative phase of approximately 180° and, thus, the R.F. signal fed back by loop 17 is essentially in phase with the R.F. signal at input terminal 18.

The phase slope $\tau$ exhibited by a transistor is equal to the change in phase $\Delta\phi$ divided by the change in frequency $\Delta\omega$ of the applied signal and can be utilized to determine the characteristics of the transistor required for the particular frequency of interest. The embodiment of FIG. 3 was designed to achieve selectivity at about 40 mHz. When fabricated with discrete components, Type 2N2475 transistors having a measured phase slope of 0.85 deg./mHz. were used. The overall transmission gain was 8 db and the measured Q was about 11. The loop gain ($\mu_0\beta_0$) was found to be 0.85.

The gains of the individual amplifiers and the amount of feedback for stabilization are determined by the ratio of the resistors in the amplifier circuits. In the embodiment shown all transistors were Type 2N2475 and the values of resistors were as follows:

| Resistors: | |
|---|---|
| 30, 35, 39, 43, 47, 48 | 56Ω |
| 36, 40 | 470Ω |
| 37, 38 | 240Ω |
| 41, 42 | 270Ω |
| 44, 46 | 560Ω |
| 31, 49 | 330Ω |
| 32, 34, 45 | 100Ω |
| 33 | 150Ω |

Figure 4:
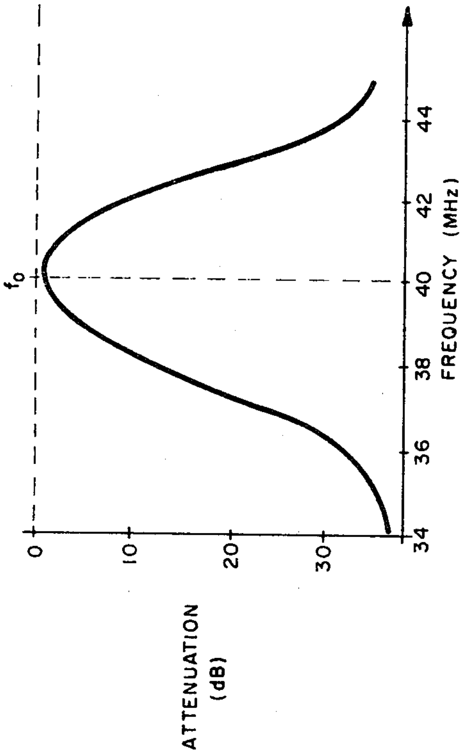
FIG. 4 is a curve showing a performance characteristic of the embodiment of FIG. 1.

In operation, the network was subjected to 20% variations in supply voltage which produced similar variations in amplifier currents without becoming unstable. The variation in sensitivity Q was found to track the variation in current. When the operating temperature was varied over an approximate 80° C. temperature range, no instability was observed and the Q center frequency of the peak response varied through a 10% range. The operating characteristic of the network of FIG. 3 is shown in FIG. 4. The ordinate is logarithmic with the db scale for attenuation relating to relative response rather than absolute transmission.

Figure 5A:
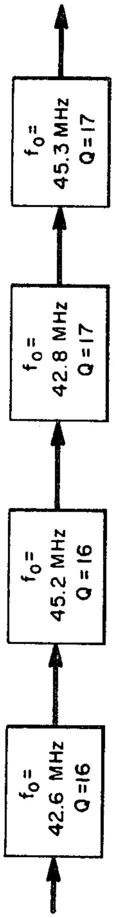
FIGS. 5*a* and 5*b* show a cascading of four networks to provide a staggered tuned I.F. amplifier and a performance characteristic therefor.
Figure 5B:
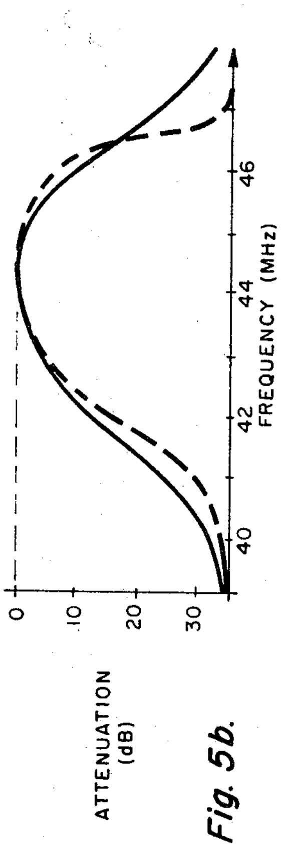

A stagger-tuned intermediate frequency or IF amplifier utilizing a cascade of four networks having different center frequencies is shown in FIG. 5*a*. When incorporated into a conventional television receiver, the response of the amplifier was found suitable for good picture reproduction. The operating characteristic of the stagger-tuned amplifier is shown in FIG. 5*b*. The characteristic of a conventional IF amplifier which included additional tuned shaping circuits for edge of the band is shown by the dashed curve of FIG. 5*b*.

While the foregoing description has referred to a specific embodiment of the invention, it will be apparent that many modifications and variations may be made therein without departing from the spirit and scope of the invention.

What is claimed is:

1. A frequency selective network for amplifying R.F. signals within a narrow frequency band comprising:
   (a) a plurality of amplifier circuits each having an input and an output terminal and being coupled in tandem to form a cascade having a forward gain $\mu_0$, said cascade having an input and an output terminal, each amplifier circuit containing a transistor as an active element thereof, said transistor being characterized by a time delay and inherent phase shift of signals amplified thereby, the cumulative time delay and inherent phase shift of the transistors in said amplifier circuits providing substantially a 180° relative phase shift between R.F. signals appearing at the input and output terminals of said cascade,
   (b) an overall feedback circuit coupled between the output and input terminals of said cascade for feeding back a portion $\beta_0$ of the signal appearing at the output terminal of said cascade, the loop gain $\mu_0\beta_0$ of the cascade and feedback circuit having a magnitude less than 1.0 and a frequency-dependent phase angle which is a function of the sum of the time delay and internal phase shifts of the amplifier circuits in said cascade, said phase angle being approximately 360° for R.F. signals within the band,
   (c) a plurality of individual negative feedback loops, each of said loops being coupled between the output terminal and the input terminal of an individual amplifier circuit, and
   (d) a plurality of buffer circuits, each of said buffer circuits being coupled between the output terminal of an amplifier circuit and the input terminal of the adjacent amplifier circuit in the cascade.

2. The network in accordance with claim 1 wherein the number of amplifier circuits in said plurality of circuits is odd whereby said overall feedback circuit provides negative D.C. feedback.

References Cited

UNITED STATES PATENTS

| | | | |
|---|---|---|---|
| 3,244,995 | 4/1966 | Barditch et al. | 330—26 X |
| 3,296,546 | 1/1967 | Schneider | 330—21 |
| 3,436,675 | 4/1969 | Lunau | 330—21 X |

ROY LAKE, Primary Examiner

J. B. MULLINS, Assistant Examiner

U.S. Cl. X.R.

330—26, 107